United States Patent [19]
Sato

[11] Patent Number: 5,498,891
[45] Date of Patent: Mar. 12, 1996

[54] EPROM WITH TRENCH IN THICK FIELD OXIDE

[75] Inventor: Noriaki Sato, Kawasaki, Japan

[73] Assignee: Fujitsu Limited, Kawasaki, Japan

[21] Appl. No.: 241,389

[22] Filed: May 12, 1994

Related U.S. Application Data

[63] Continuation of Ser. No. 810,408, Dec. 20, 1991, abandoned.

[30] Foreign Application Priority Data

Dec. 20, 1990 [JP] Japan ................................. 2-404246

[51] Int. Cl.$^6$ .................................................. H01L 29/788
[52] U.S. Cl. ............................ 257/316; 257/322; 257/397; 257/513
[58] Field of Search ..................................... 257/315, 316, 257/510, 513, 509, 397, 648, 322

[56] References Cited

U.S. PATENT DOCUMENTS

| | | | |
|---|---|---|---|
| 4,326,331 | 4/1982 | Guterman | 257/316 |
| 4,679,304 | 7/1987 | Bois | 257/510 |
| 4,713,677 | 12/1987 | Tigelaar et al. | 257/316 |
| 5,051,795 | 9/1991 | Gill et al. | 257/510 |
| 5,111,257 | 5/1992 | Andoh et al. | 257/316 |
| 5,451,803 | 9/1995 | Oji et al. | 257/316 |

FOREIGN PATENT DOCUMENTS 62-31177A  2/1987  Japan .

*Primary Examiner*—Robert P. Limanek
*Attorney, Agent, or Firm*—Staas & Halsey

[57] ABSTRACT

An erasable-programmable read only memory (EPROM) allowing a miniaturization of an isolation region (a field insulating layer) without generating a parasitic transistor. The EPROM includes a semiconductor substrate, a field insulating layer defining a device formation region of the semiconductor substrate, a gate insulating layer and a floating gate formed on the field insulating layer and the field insulating layer. The EPROM further includes a trench insulating layer extending into the semiconductor substrate at the center portion of the field insulating layer so that one of the side walls of the trench insulating layer is self-aligned with the end face of the floating gate. A first interlaminar insulating layer covers the floating gate, and a control gate is located above the first interlaminar insulating layer. A second interlaminar insulating layer is formed over the control gate and a bit line is formed on the second interlaminar insulating layer.

7 Claims, 9 Drawing Sheets

EPROM WITH TRENCH IN THICK FIELD OXIDE

This application is a continuation of application Ser. No. 07/810,408, filed Dec. 20, 1991, now abandoned.

BACKGROUND OF THE INVENTION

1. Field of the Invention

The present invention relates to a semiconductor memory device, and more particularly, to an EPROM (erasable-programmable read only memory) having FAMOS (floating gate avalanche injection MOS) type cells, and a method of producing the same.

2. Description of the Related Art

Attempts are now under way to increase an integration level and miniaturize each cell of an EPROM. The miniaturization of the EPROM cell requires the miniaturizing of an isolation region. In this connection, when data is written to the EPROM cell, a writing voltage (about 12 volts) higher than that used in another memory device, such as a DRAM and SRAM, is applied to a word line (i.e., a control gate), and in this case, a conventional EPROM shown in FIGS. 1, 2 and 3 may generate a parasitic field transistor (i.e., isolation failure) between cells adjacent to each other, as indicated by a broken line arrow "a or b". Such a parasitic transistor will cause a writing failure and a reading error, and thus it is necessary to prevent a leakage of the parasitic transistor operation, to thereby ensure a normal operation of the EPROM.

Referring to FIGS. 1, 2 and 3, a conventional EPROM comprises a p-type silicon (Si) single crystalline substrate, a field insulating layer (oxide layer) 2 of $SiO_2$, a floating gate 3, an interlaminar insulating layer (dielectric film of a capacitor) 4, a control gate 5, i.e., a word line, another interlaminar insulating layer 6, and a bit line 7. A gate insulating layer 8 lies between the Si substrate 1 and the floating gate 3, $n^+$-type source regions 9 and drain region 10 (in FIGS. 2 and 3) are formed in the Si substrate 1, and the bit line 7 comes into contact with the drain region 10 at a contact hole 11.

To prevent the generation of a parasitic transistor, i.e., the occurrence of a leakage current, an isolation effect of the field insulating layer must be improved, and accordingly, the following three ways of accomplishing this have been proposed. As shown in FIG. 4, the first way is to increase the thickness of the field insulating layer (A); the second way is to increase an impurity concentration of a channel cut region ($p^+$-type region, channel stopper) formed directly under the field insulating layer (e.g., to $5 \times 10^{13}/cm^2$ from $3 \times 10^{13}/cm^2$ (B); and the third way is to form an additional high concentration channel cut region ($p^{++}$-region) having an increased concentration at a center of the channel cut region (C).

Where the first way is used, when a voltage of about 12 volts is applied to the word line for writing, taking voltage margin (safety margin) into consideration, it is necessary to make the thickness of the field insulating (oxide) layer about 630 nm or more, to thereby attain a threshold voltage Vth of the parasitic transistor of 17 volts or more. When such a thick field insulating layer is formed by a thermal oxidation process, a bird's beak having a width of about 300 nm (a total of about 600 nm at both sides of one field insulating layer) is generated to prevent a reduction of the field insulating layer width (miniaturization). If the thickness of the field insulating layer is reduced, the bird's beak is diminished, but in this case, the threshold voltage of the parasitic transistor is lowered and a parasitic transistor is easily generated. If the field insulating layer is further thickened, the step coverage problem becomes serious because a surface step is made large at a later formation step of a bit line (metal wiring), with the result that such problems as wiring breakdowns and an increased wiring resistivity are increased.

With regard to the second way, i.e., increasing the dose concentration of the channel cut region as a whole, the doped impurities are undesirably diffused in a lateral direction by a heat-treatment, to thereby extend the channel cut region (impurity doped region) beyond the bird's beak. Accordingly, the channel cut region invades the device formation region 18, and therefore, the gate width is narrowed (i.e., a narrow-channel effect is caused), with the result that a threshold voltage Vth of the normal MOS transistor of the EPROM cell is varied.

With regard to the third way, i.e., forming an additional high concentration region at the center of the channel region, although the threshold voltage Vth of the parasitic transistor is sufficiently increased, the width of the isolation region (i.e., field insulating layer) is increased by the width of the high concentration region, to thus prevent a miniaturization of the device.

Futhermore, miniaturization of the EPROM is impeded. When floating gate patterning step is performed as an independent step. As shown in FIG. 5, the floating gates 3 under one (the same) control gate 5 are separated by selectively etching a conductor layer on the field insulating layer 2 by a width L. Such a floating gate 3 extends onto the field insulating layer 2, because a capacitance (C1) of the interlaminar insulating layer 4 sandwiched between the floating gate 3 and the control gate 5 becomes greater than a capacitance (C2) of the gate insulating layer 8 sandwiched between the floating gate 3 and the Si substrate 1, to thus increase the ratio of C1/C2. Such an increase of the ratio of C1/C2 raises an effective voltage between the floating gate and the Si substrate upon writing and reading, to ensure accurate writing and reading operations. Nevertheless, the extension of the floating gate 3 onto the field insulating layer 2 causes an elongation of the field insulating layer 2, which is undesirable for a miniaturization of the device. In a patterning of the floating gate, an overlapping margin (alignment allowance) of a distance D from the end of the field insulating layer 2 to the end of the floating gate 3 must be, e.g., about 0.3 µm, taking an alignment accuracy of a stepper into consideration. Furthermore, an etching width L can be shortened only to the minimum patterning width (about 0.4 µm), depending on an exposure and etching technique. Therefore, the field insulating layer must have a width of about 1 µm, which limits any shortening (miniaturization).

SUMMARY OF THE INVENTION

An object of the present invention is to provide an EPROM (and a method of producing the same) in which an isolating region (a field insulating layer) can be reduced (miniaturized) without generating a parasitic transistor.

The above-mentioned and other objects of the present invention are attained by providing an EPROM which comprises a semiconductor substrate; a field insulating layer defining a device formation region of the semiconductor substrate; a gate insulating layer formed on the device formation region; a floating gate formed on the gate insulating layer and the field insulating layer; a trench insulating layer extending into the semiconductor substrate at the center portion of the field insulating layer, one of the side walls of the trench insulating layer being self-aligned with the end face of the floating gate; a first interlaminar insulating layer covering the floating gate; a control gate formed on the first insulating layer and located above the floating gate; a second interlaminar insulating layer formed over the whole surface; and a bit line formed on the second insulating layer and traversing the floating gate and control gate.

Another object of the present invention is attained by providing a method of producing an EPROM, comprising steps (a) to (k) of: (a) forming a field insulating layer defining a device formation region, on a semiconductor substrate; (b) forming a gate insulating layer on the surface of the device formation region; (c) forming a first conductor layer on the whole surface; (d) forming a trench spreading through the first conductor layer and field insulating layer in the semiconductor substrate; (e) filling the trench with an insulator; (f) forming a first interlaminar insulating layer covering the first conductor layer; (g) forming a second conductor layer on the whole surface; (h) selectively etching the second conductor layer, first interlaminar insulating layer and first conductor layer to form a floating gate and a control gate; (i) ion-implanting impurity ions in the semiconductor substrate to form a source region and a drain region; (j) forming a second interlaminar insulating layer on the whole surface; and (k) forming a bit line traversing the floating gate and control gate, on the second insulating layer.

In accordance with the present invention, a trench isolation is added to a conventional isolation of the field insulating layer, and an end face of the floating gate is self-aligned with the end face of the trench insulating layer (i.e., the side walls of the trench).

Since the trench insulating layer is additionally formed at the center of the field insulating layer, a distance from the top surface of the field insulating layer to the bottom of the trench insulating layer is large enough, to prevent a leakage current from flowing under these insulating layers. Where such a distance is larger than a thickness of a conventional field insulating layer, it is possible to make the thickness of the field insulating layer thinner than in a conventional case, and as a result, a bird's beak can be made smaller to thus also make the width of the field insulating layer smaller.

The shape of the floating gate is defined by self-aligning same with the trench and control gate, respectively, so that there is no shift in the alignments and it is unnecessary to allow an alignment margin, and thus it is suitable for a miniaturization of the (insulator) isolation. Furthermore, since the isolation can be attained without varying the floating gate area, the ratio of C1/C2 is the same as that in a conventional case.

BRIEF DESCRIPTION OF THE DRAWINGS

The present invention will be more apparent from the description of the preferred embodiments set forth below, with reference to the accompanying drawings, in which:

FIGS. 9a, 10a, 11a, 12a, 13, 14a and 15 are schematic sectional views of the EPROM (in a word line direction) in various stages of production in accordance with a first embodiment of the present invention;

FIGS. 9b, 10b, 11b, 12b, 13b, 14b and 15 are schematic sectional views of the EPROM (in a bit line direction) in various stages of production in accordance with a first embodiment of the present invention.

DESCRIPTION OF THE PREFERRED EMBODIMENTS

Figure 1:
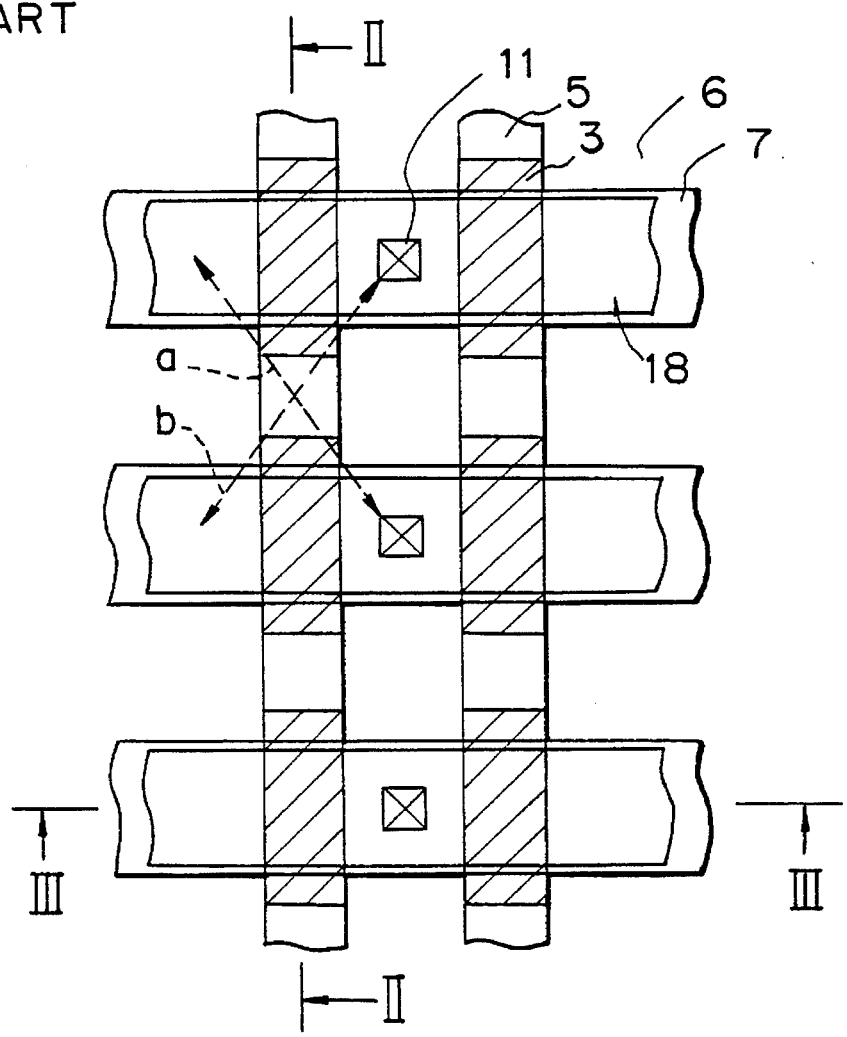
FIG. 1 is a schematic plan view of a conventional EPROM.
Figure 2:
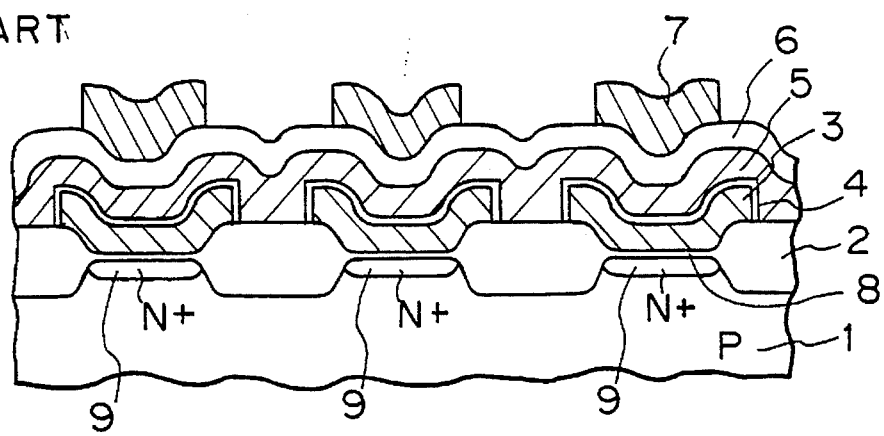
FIG. 2 is a sectional view taken along a line II—II of FIG. 1.
Figure 3:
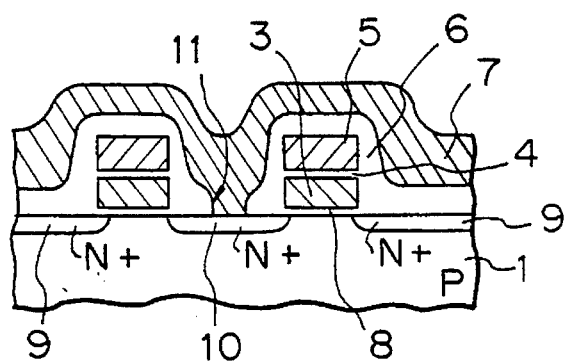
FIG. 3 is a sectional view taken along a line III—III of FIG. 1.
Figure 4:
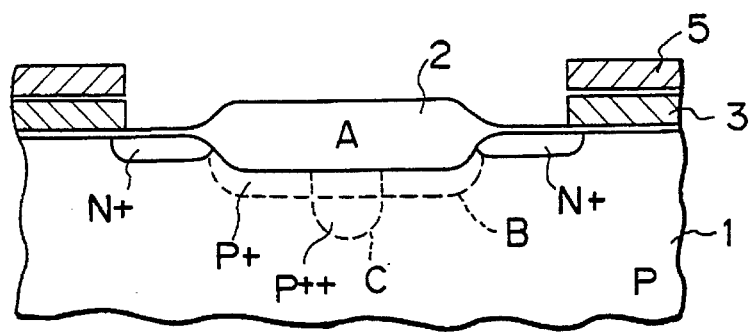
FIG. 4 is a partly schematic sectional view of a conventional EPROM, for illustration of isolation techniques.
Figure 5:
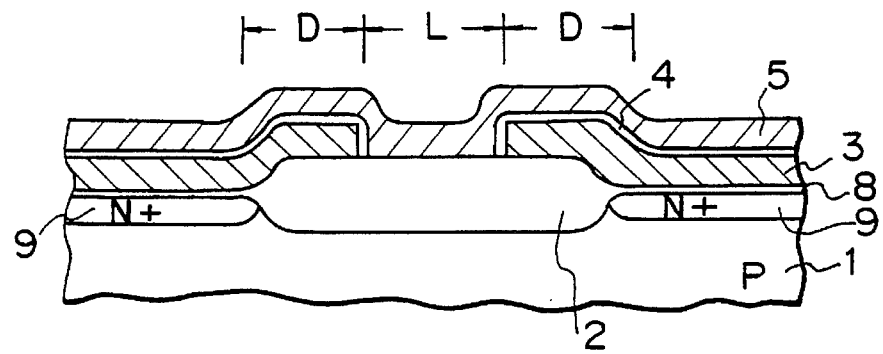
FIG. 5 is a partly schematic sectional view of a conventional EPROM, in a word line direction.

Referring to FIGS. 6, 7, 8a and 8b, the reference numerals used therein are the same as those used in the explanation of the related art, and designate corresponding parts of an EPROM. FIGS. 6, 7, 8a and 8b are similar drawing perspectives to FIGS. 1, 2 and 3, respectively. A basic difference between an EPROM according to the present invention and a conventional EPROM is a formation of a trench insulating layer 21 of a trench filled with an insulator at a center of a field insulating layer 2 (i.e., between cells of the EPROM) according to the present invention.

As shown in FIGS. 6, 7, 8a and 8b, a thick field insulating (oxide) layer 2 of $SiO_2$ and a thin gate insulating layer 8 of $SiO_2$ are formed on a surface of a p-type silicon (Si) substrate 1, the layer 8 corresponding to a device formation region 18. A floating gate 3 of polycrystalline silicon, a thin first interlaminar insulating layer 4 of $SiO_2$, and a word line (i.e., a control gate) 5 are formed in sequence on these insulating layers 2 and 8, the layer 4 serving as a dielectric layer of a capacitor. Then, a second interlaminar insulating layer 6 is formed on the whole surface, and a bit line 7 of, e.g., aluminum, is formed at a right angle to the word line 5 thereon. Furthermore, source regions 9 and a drain region 10 of MOS transistors are formed in the device formation region 18 of the Si substrate 1, and the bit line 7 is brought into contact with the drain region 10 through a contact hole 11.

Figure 6:
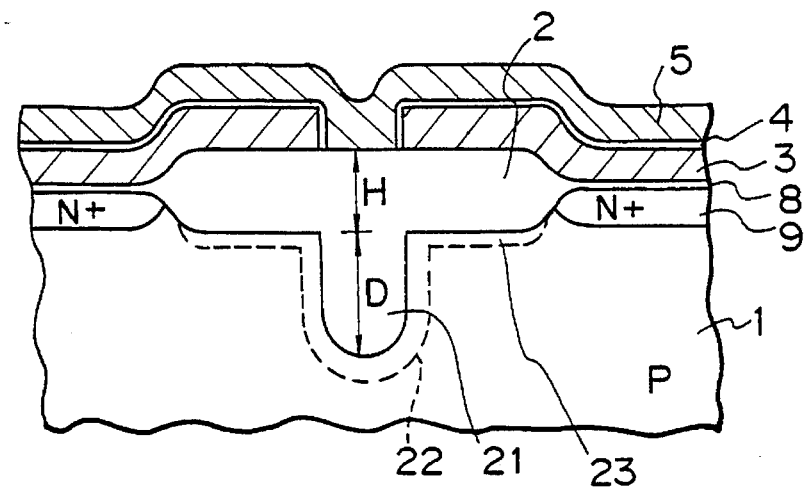
FIG. 6 is a partly schematic sectional view of an EPROM according to the present invention, in a word line direction.
Figure 8A:
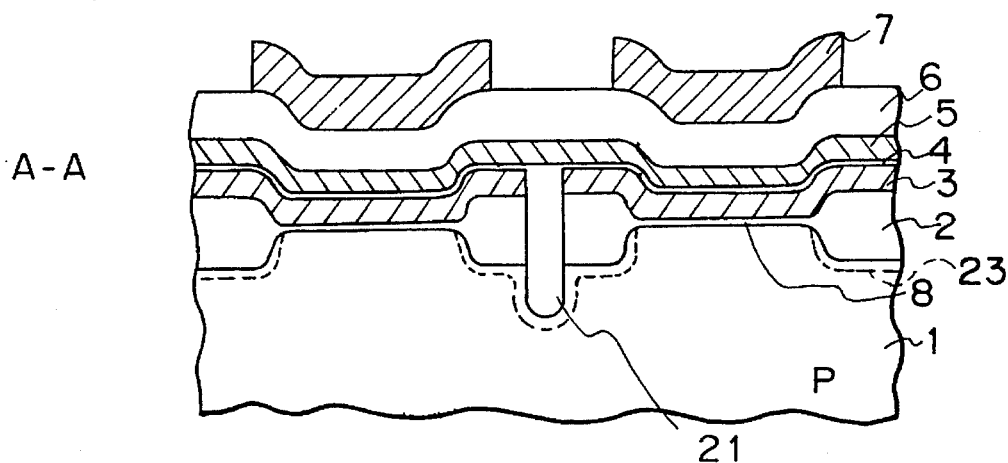
FIG. 8a is a schematic sectional view taken along a line A—A of FIG. 7 in a word line direction)

According to the present invention, a trench insulating layer 21 serving as a trench isolation is spread downward in the Si substrate 1 from the center portion of the field insulating layer 2, and both side walls of the trench insulating layer 21 are aligned with end faces of the floating gates 3, respectively, as shown in FIGS. 6 and 8a. Such an alignment is attained by performing a formation of a trench and a formation of the floating gate end face in an self-alignment system. Furthermore, since longitudinal side walls of the floating gate 3 and those of the control gate 5 are formed in a self-alignment system, the former side walls correspond to the latter side walls, and therefore, a patterning step for a floating gate only is omitted.

To utilize the trench isolation effectively, preferably a depth D (FIG. 6) of the trench insulating layer 21 extending from the bottom of the field insulating layer 2 is not less than a thickness H of the field insulating layer 2 (D≧H). When the total (D+H) of the thickness of the field insulating layer 2 and the depth of the trench insulating layer 21 is larger than a thickness of a conventional field insulating layer, the insulating layers 2 and 21 have an isolation effect of preventing a parasitic transistor from occurring at a level similar to that of a conventional field insulating layer. Accordingly, it is possible to make the thickness of the field insulating layer 2 thinner than in a conventional case, and thus a bird's beak can be reduced.

Furthermore, a channel cut region 22 (FIG. 6) is formed in the Si substrate portion surrounding the trench insulating layer 21, to increase an effect of preventing a leakage current, and as a result, it is possible to reduce an impurity concentration of a channel cut region 23 under the field insulating layer 2, and the channel cut region (channel stopper) may be omitted if so required. Accordingly, it is possible to reduce a diffusion expansion of the channel cut region into the device formation region, whereby a tendency to generate a narrow-channel effect can be prevented.

Referring to FIGS. 7 to 15a and 15b, the EPROM according to the present invention is produced in the following manner. FIGS. 9a to 15a and FIGS. 9b to 15b are partial sectional views of the EPROM to be produced, taken along a line A—A and a line B—B of FIG. 7, respectively.

Figure 9A:
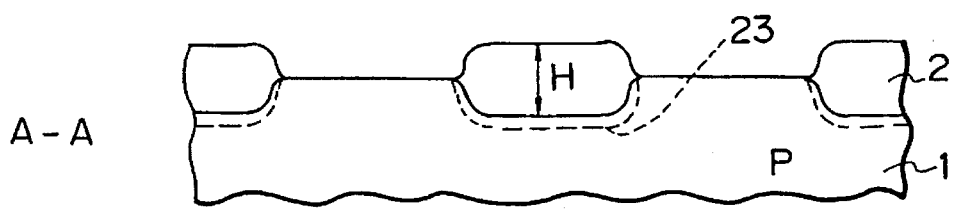
Figure 9B:

First, as shown in FIGS. 9a and 9b, a p-type (100) Si substrate 1 having a resistivity of 10Ω-cm is prepared and is selectively doped with boron ($B^+$) at a dose of $1 \times 10^{13}/cm^2$ by an ion-implantation process, to obtain a channel cut region. The Si substrate 1 is selectively oxidized by a conventional thermal oxidation process to form a field insulating layer 2 (thickness H: about 200 nm) of $SiO_2$. FIG. 9b illustrates a section of a portion of the Si substrate 1 at a device formation region 18 surrounded by the field insulating layer 2. This thickness of the field insulating layer 2 is thinner than that of a field insulating layer of a conventional EPROM, and therefore, a bird's beak of the insulating layer 2 is also smaller than in a conventional case. A channel cut region 23 is simultaneously formed and has a smaller dose than a conventional dose of about $3 \times 10^{15}/cm^2$.

Figure 10A:
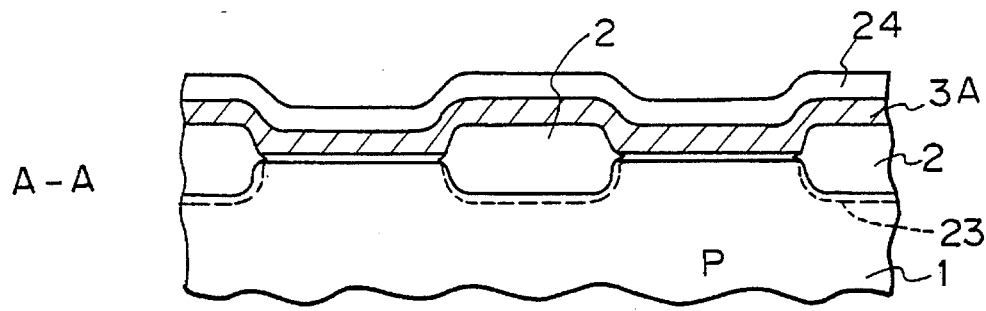
Figure 10B:
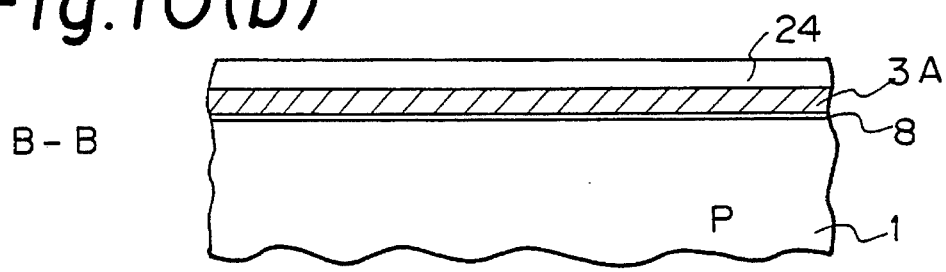

As shown in FIGS. 10a and 10b, the device formation region surface of the Si substrate 1 is oxidized to form a thin gate insulating layer ($SiO_2$ layer) 8 (thickness: 10 nm), by a thermal oxidation process. Next, polycrystalline silicon doped with p-type impurities is deposited on the whole surface by a CVD (chemical vapor deposition) process, to form a first conductor layer 3A having a thickness of 200 nm. The layer 3A is patterned in a later step to become a floating gate 3. A $SiO_2$ mask layer (insulator layer) 24 (thickness: about 500 nm) is formed on the first conductor layer 3A, by a CVD process.

Figure 11A:
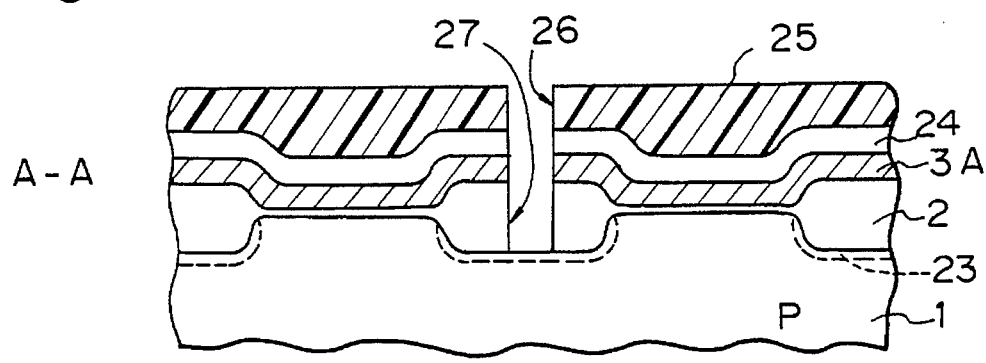
Figure 11B:
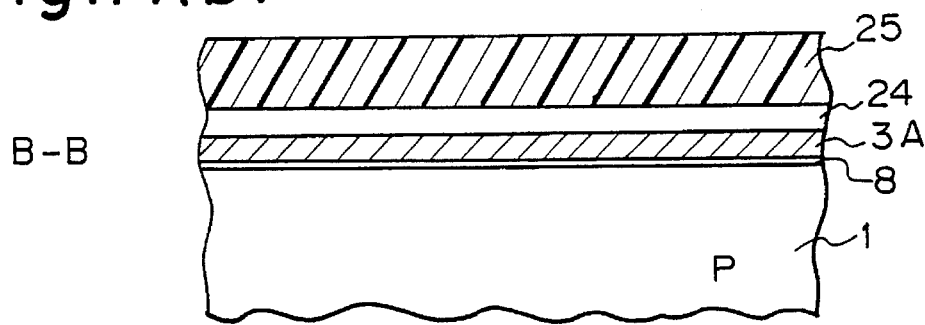

As shown in FIGS. 11a and 11b, a resist is applied on the mask layer 24, and exposed and developed to form a resist pattern layer 25 having a pattern opening 26 corresponding to a trench insulating layer. Then, using the resist layer 25 as a mask, the $SiO_2$ mask layer 24, the polycrystalline silicon layer 3A, and field insulating layer 2 are selectively etched in sequence by an RIE (reactive ion etching) process, to form a trench 27.

Figure 12A:
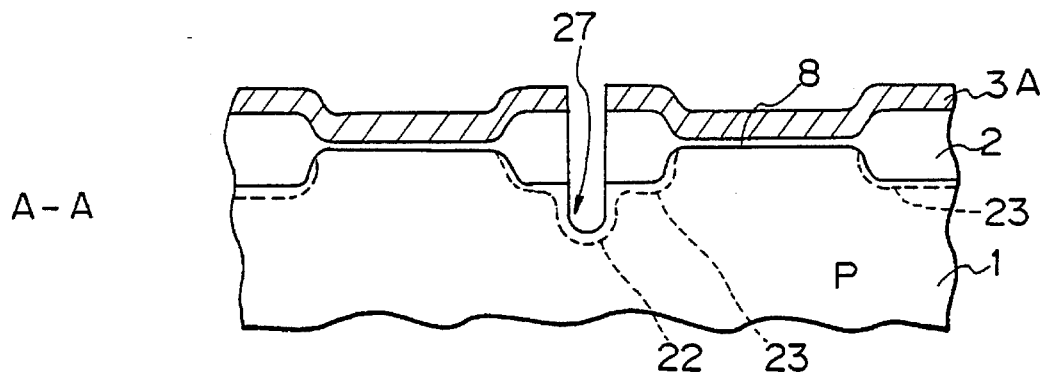
Figure 12B:
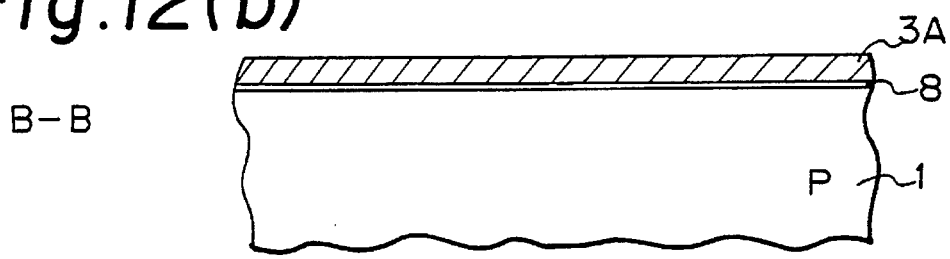

After removing the resist mask layer 25, as shown in FIGS. 12a and 12b, using the $SiO_2$ layer 24 as a mask, the Si substrate 1 is selectively etched by a RIE process to deepen the trench 27. The depth D (FIG. 6) of the trench portion in the Si substrate 1 becomes about 200 nm. The Si substrate 1 is doped with boron at a dose of $8 \times 10^{12}/cm^2$ through the trench 27 by an ion-implantation process, to form a channel cut region (channel stopper) 23. The $SiO_2$ layer 24 is removed by an etching process.

Figure 13A:
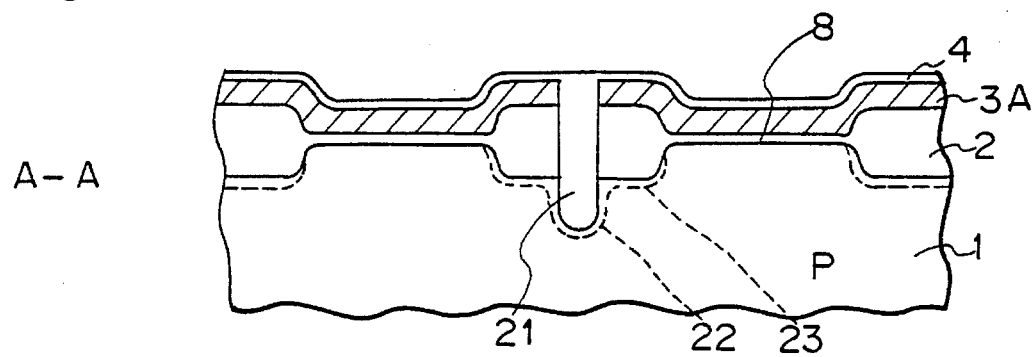
Figure 13B:
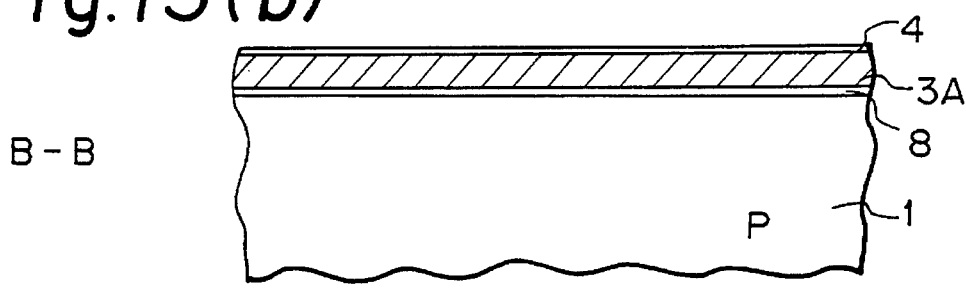

As shown in FIGS. 13a and 13b, the trench 27 is filled with $SiO_2$ (or another insulator such as PSG) by a CVD process. In this case, $SiO_2$ is deposited over the whole surface including the trench 27, and most of the deposited $SiO_2$ on the first conductor layer 3A is removed by an etching process, leaving a portion thereof in the trench 27, so that the trench 27 is filled with $SiO_2$ (insulator) to complete a trench insulating layer 21. Then, the polycrystalline silicon (first conductor) layer 3A is thermally oxidized to form a first interlaminar insulating layer 4 (thickness: about 100 nm) of $SiO_2$. The layer 4 serves as a dielectric layer of a capacitor.

Figure 14A:
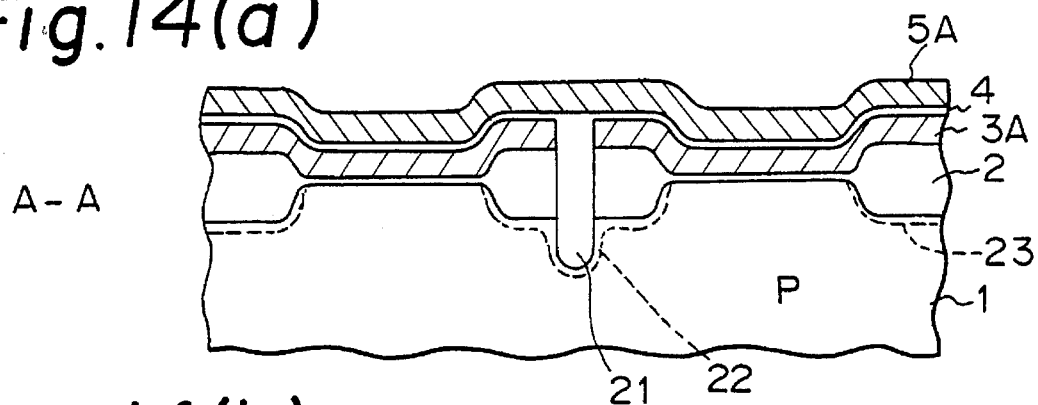
Figure 14B:
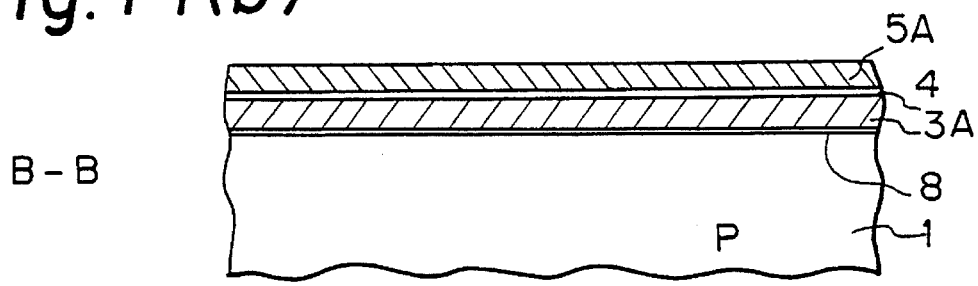

As shown in FIGS. 14a and 14b, polycrystalline silicon doped with p-type impurities is deposited on the insulating layer 4 by a CVD (chemical vapor deposition) process to form a second conductor layer 5A having a thickness of about 150 nm. The layer 5A is patterned in a later step to become a control gate (i.e., word line) 5.

Figure 7:
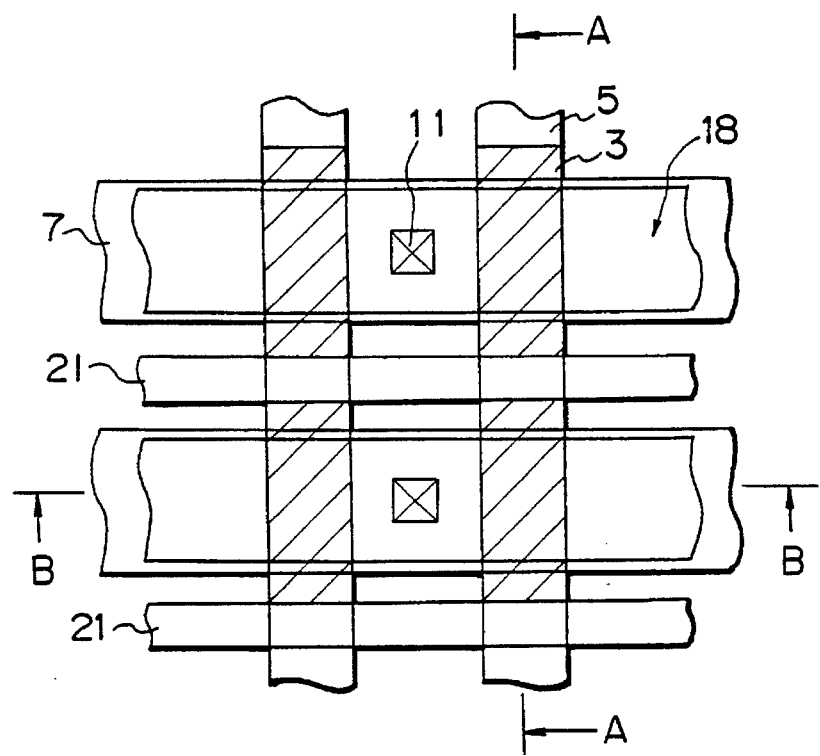
FIG. 7 is a schematic plan view of an EPROM according to the present invention.
Figure 15A:
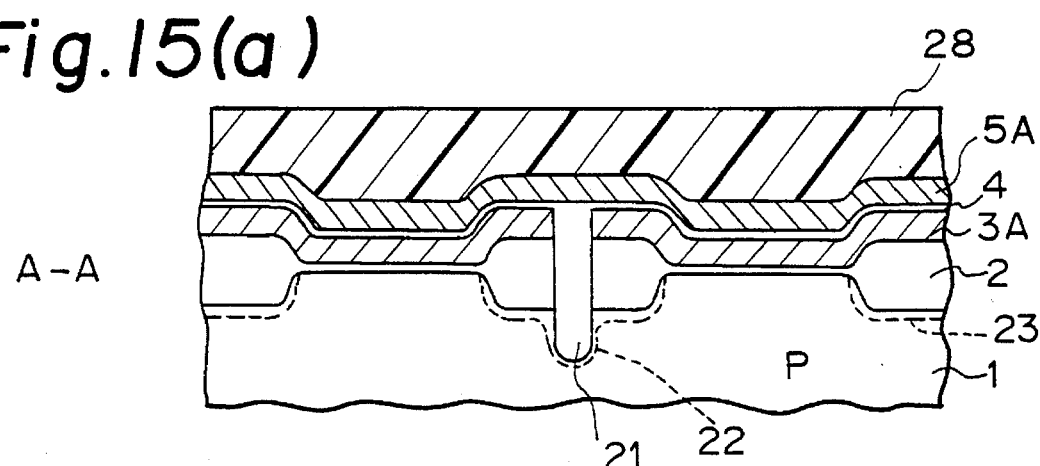
Figure 15B:
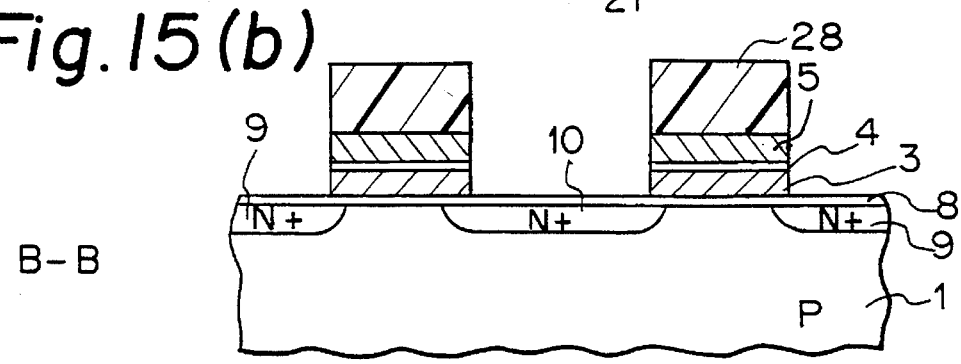

Next, as shown in FIGS. 15a and 15b, resist is applied on the whole surface, and exposed and developed to form a resist pattern layer 28 corresponding to a control gate pattern. Using the resist layer 28 as a mask, the second conductor layer 5A, first interlaminar insulating layer 4, and first conductor layer 3A are selectively etched in sequence by an RIE process to complete the control gate 5 and floating gate 3. At this time, the control gate 5 covers the plurality of floating gates 3, as shown in FIG. 7, and both longitudinal side walls of the floating gates 3 are self-aligned with those of the control gate 5. N-type impurities (As or P) are doped in the Si substrate 1 by an ion-implantation process at, e.g., an As dose of $4 \times 10^{15}/cm^2$, to form doped regions (source regions 9 and drain region 10 in FIG. 15b).

Figure 8B:
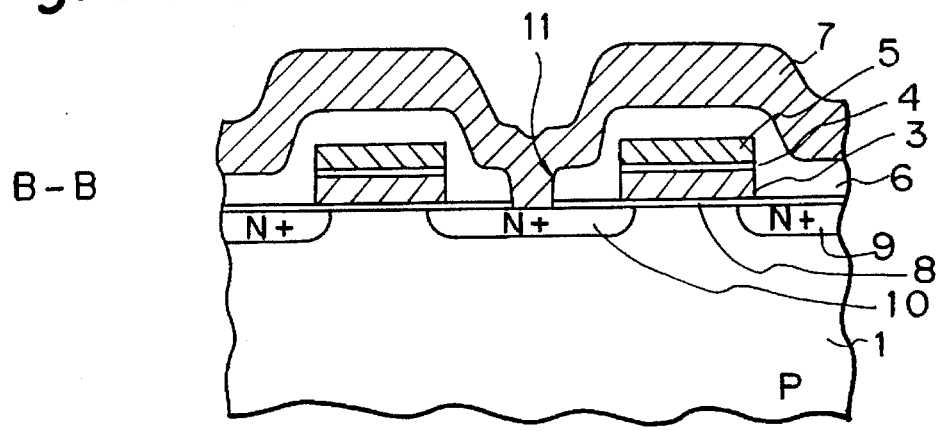
FIG. 8b is a schematic sectional view taken along a line B—B of FIG. 7 (in a bit line direction)

Thereafter, as shown in FIGS. 8a and 8b, a second interlaminar insulating layer 6 (thickness: about 500 nm) of $SiO_2$ or PSG is formed on the whole surface, by a CVD process. The insulating layer 6 is selectively etched to open a contact hole 11 (having a size of, e.g., 0.8 μm×0.8 μm), so that a portion of the drain region 10 is exposed, and then a second conductor layer (thickness: 700 nm) is formed on the insulating layer 6 by, e.g., a sputtering process, and is patterned to complete a bit line 7, and thus the EPROM is obtained.

Figure 16:
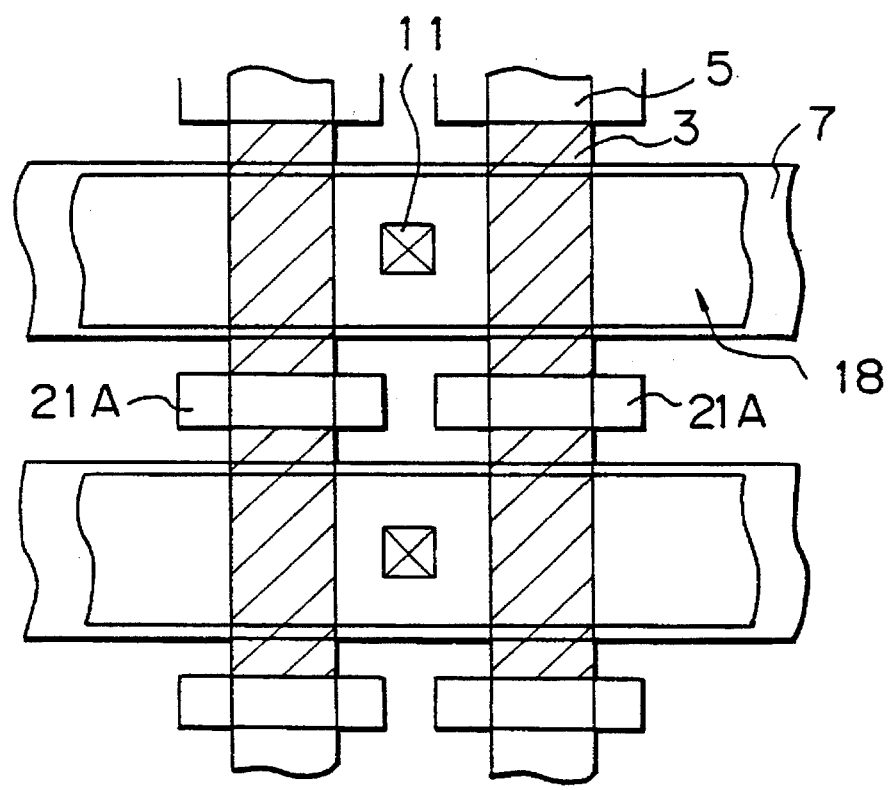
FIG. 16 is a schematic plan view of an EPROM according to a second embodiment of the present invention.

According to a second embodiment of the present invention, as shown in FIG. 16, one (long) trench insulating layer is divided into a plurality of (short) trench insulating layers 21A per word line. When the resist mask layer having an opening is patterned for forming a trench, as shown in FIG. 11a, the developed resist layer having an opening shape corresponding to a narrow and long trench pattern is liable to cause such disadvantages as a variation of an opening width and remaining resist whiskers. Therefore, the trench pattern opening length is shortened to improve the accuracy of the opening shape, which contributes to an improvement of the yield rate of the product and the reliability thereof.

As mentioned above, the adoption of the trench insulating layer and the self-alignment between the trench insulating layer and the floating gate makes the field insulating layer thinner and the bird's beak smaller, so that the insulator isolation width is shorter than in a conventional case, and thus contribute to a miniaturization of the device. For example, if the field insulating layer has a thickness of 200 nm and the trench insulating layer has a width of 200 nm, it is possible to shorten the insulator isolation width to 400 nm.

Since an undesirable diffusion expansion of a channel cut region can be prevented, the narrow-channel effect is also prevented. Furthermore, it is possible to lower an impurity concentration of the channel cut region coming into contact with the source and drain regions of a MOS transistor, whereby a parasitic capacitance between the source and drain regions and the Si substrate is reduced to thus increase the reading speed.

It will be obvious that the present invention is not restricted to the above-mentioned embodiments and that many variations are possible for persons skilled in the art without departing from the scope of the invention.

I claim:

1. An erasable-programmable read only memory (EPROM) comprising:

a semiconductor substrate;

a field insulating layer defining a device formation region of said semiconductor substrate, wherein the device formation region includes a source region and a drain region;

a gate insulating layer formed on said device formation region;

a floating gate formed on said gate insulating layer and said field insulating layer, wherein the floating gate does not substantially extend above the source region and the drain region;

a trench insulating layer extending into said semiconductor substrate at a center portion of said field insulating layer, one of side walls of said trench insulating layer being partially self-aligned with an end face of said floating gate;

a first interlaminar insulating layer covering said floating gate;

a control gate formed on said first interlaminar insulating layer and located above said floating gate;

a second interlaminar insulating layer formed over said control gate; and a bit line formed on said second interlaminar insulating layer and traversing said floating gate and control gate, wherein the control gate is a word line arranged in a perpendicular direction to the bit line, and to a carrier flow direction between the source region and the drain region.

2. An EPROM according to claim 1, wherein said semiconductor is a silicon single crystalline substrate, and said field insulating layer, gate insulating layer and first interlaminar insulating layer are $SiO_2$ layers.

3. An EPROM according to claim 1, wherein said floating gate and control gate are polycrystalline silicon layers.

4. An EPROM according to claim 3, wherein longitudinal side walls of said floating gate are self-aligned with longitudinal side walls of said control gate.

5. An EPROM according to claim 1, wherein a depth of said trench insulating layer extending into said semiconductor substrate from said field insulating layer is not less than a thickness of said field insulating layer.

6. An erasable-programmable read only memory (EPROM) comprising:

a semiconductor substrate;

a field insulating layer formed on said semiconductor substrate and defining a device formation region on said semiconductor substrate;

a floating gate formed on said field insulating layer;

a trench insulating layer formed by forming an insulator layer on said floating gate, forming a resist mask layer on said insulator layer, selectively etching said insulator layer, floating gate, and field insulating layer by using said resist layer as a mask to form a trench, removing said resist layer, selectively etching said semiconductor to complete the trench, removing said insulator layer by etching, and filling the trench with an insulator;

a first interlaminar insulating layer formed over said floating gate;

a control gate formed on said first interlaminar insulating layer;

a second interlaminar insulating layer formed over said control gate; and a bit line formed on said second interlaminar insulating layer.

7. An erasable-programmable read only memory (EPROM) comprising:

a semiconductor substrate including source and drain regions provided along a first direction;

a field insulating layer formed on the semiconductor substrate and having first and second thick portions separated by a thin portion, the first and second thick portions being formed along the first direction;

a floating gate formed on the field insulating layer in a second direction approximately perpendicular to the first direction;

a trench insulating layer formed along the first direction in the field insulating layer, including a first protruding portion which extends into the semiconductor substrate from the first thick region of the field insulating layer, and a second protruding portion extending into the semiconductor substrate from the second thick portion of the field insulating layer;

a first insulating layer formed over the floating gate;

a control gate formed over the first insulating layer along the second direction;

a second insulating layer formed over the first control gate; and a bit line formed along the first direction on the second insulating layer, the bit line contacting with the drain region through an opening in the second interlaminar insulating layer.

\* \* \* \* \*

UNITED STATES PATENT AND TRADEMARK OFFICE
CERTIFICATE OF CORRECTION

PATENT NO. : 5,498,891

DATED : March 12, 1996

INVENTOR(S) : Noriaki SATO

It is certified that error appears in the above-indentified patent and that said Letters Patent is hereby corrected as shown below:

Col. 1, line 51, after "cm$^2$" (second occurrence) insert --)--.

Col. 2, line 26, delete ".";
line 27, change "When" to --when--.

Col. 3, line 67, change "." to --;--.

Col. 4, line 9, after "7" insert --(--;
line 12, change "13" to --13a--; change "15" to --15a--;
line 16, change "15" to --15b--.

Signed and Sealed this

Eleventh Day of June, 1996

BRUCE LEHMAN

*Attest:*

*Attesting Officer*                     Commissioner of Patents and Trademarks